(12) United States Patent
Kudo et al.

(10) Patent No.: US 8,207,806 B2
(45) Date of Patent: Jun. 26, 2012

(54) MAGNETIC OSCILLATION ELEMENT

(75) Inventors: Kiwamu Kudo, Kamakura (JP); Koichi Mizushima, Kamakura (JP); Tazumi Nagasawa, Yokohama (JP); Rie Sato, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/216,968

(22) Filed: Aug. 24, 2011

(65) Prior Publication Data

US 2012/0032763 A1 Feb. 9, 2012

Related U.S. Application Data

(63) Continuation of application No. PCT/JP2009/070045, filed on Nov. 27, 2009.

(30) Foreign Application Priority Data

Feb. 24, 2009 (JP) .................................. 2009-041100

(51) Int. Cl.
*H01F 1/00* (2006.01)
*H01F 3/00* (2006.01)
*H01F 7/00* (2006.01)
(52) U.S. Cl. ............ 335/296; 335/87; 335/90; 335/223; 335/235; 331/96
(58) Field of Classification Search .................. 335/87, 335/90, 223, 235, 296; 331/96
See application file for complete search history.

(56) References Cited

U.S. PATENT DOCUMENTS

| | | | | |
|---|---|---|---|---|
| 7,800,938 B2 * | 9/2010 | Rivkin et al. | ................. | 365/158 |
| 7,808,330 B2 * | 10/2010 | Fukuzawa et al. | ............. | 331/96 |
| 7,859,349 B2 * | 12/2010 | Eyckmans et al. | ........... | 331/94.1 |
| 7,965,474 B2 * | 6/2011 | Sato et al. | ................. | 360/324.12 |
| 2006/0039089 A1 * | 2/2006 | Sato | ............................. | 360/324 |
| 2008/0074806 A1 | 3/2008 | Sato et al. | | |
| 2009/0080109 A1 * | 3/2009 | Fukuzawa et al. | ............ | 360/122 |
| 2009/0244788 A1 * | 10/2009 | Sato | ............................. | 360/324 |
| 2010/0308946 A1 * | 12/2010 | Kawakami et al. | ........... | 335/296 |

FOREIGN PATENT DOCUMENTS

| | | |
|---|---|---|
| JP | 2008-53915 A | 3/2008 |
| JP | 2008-84879 A | 4/2008 |

OTHER PUBLICATIONS

Thadani, K.V. et al., "Strong linewidth variation for spin-torque nano-oscillators as a function of in-plane magnetic field angle," Physical Review B, 2008.07, vol. 78, issue 2, art. 024409.
Kudo, K. et al., "Amplitude-phase coupling in a spin-torque nano-oscillator," Journal of Applied Physics, Feb. 3, 2009, vol. 105, issue 7, art. 07D105.

(Continued)

*Primary Examiner* — Mohamad Musleh
(74) *Attorney, Agent, or Firm* — Oblon, Spivak, McClelland, Maier & Neustadt, L.L.P.

(57) ABSTRACT

According to one embodiment, magnetization directions of a magnetic free layer and a magnetic pinned layer are parallel to junction planes between the magnetic free layer and a spacer layer and between the magnetic pinned layer and the spacer layer. The magnetic free layer has a uniaxial magnetic anisotropy, and generates a magnetization oscillation when a current larger than an oscillation threshold current flows through the magnetic free layer. A magnetic field generator controls a magnitude and a direction of an external magnetic field to cancel a shift amount of an oscillation frequency caused by a diamagnetic field due to the magnetization oscillation and a shift amount of the oscillation frequency caused by a magnetic field due to the uniaxial magnetic anisotropy.

5 Claims, 8 Drawing Sheets

OTHER PUBLICATIONS

International Search Report issued Feb. 23, 2010 in PCT/JP2009/070045 filed Nov. 27, 2009 (with English Translation).

Written Opinion issued Feb. 23, 2010 in PCT/JP2009/070045 filed Nov. 27, 2009.

* cited by examiner

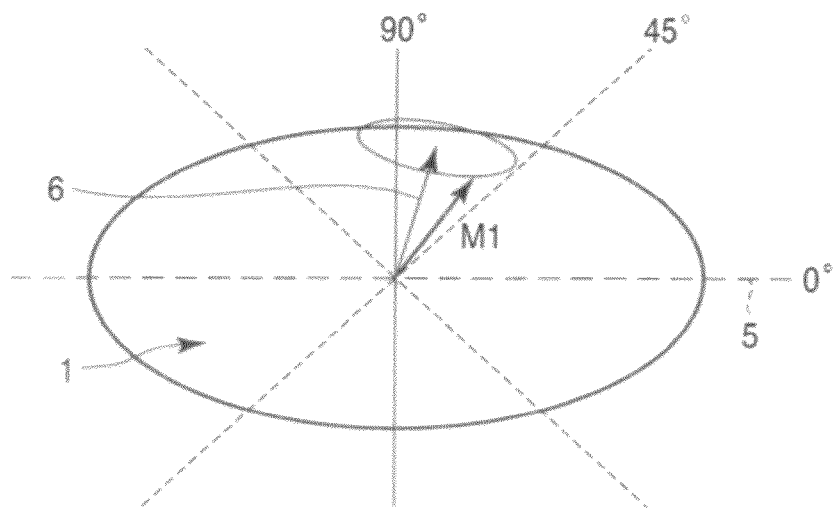
F I G. 3
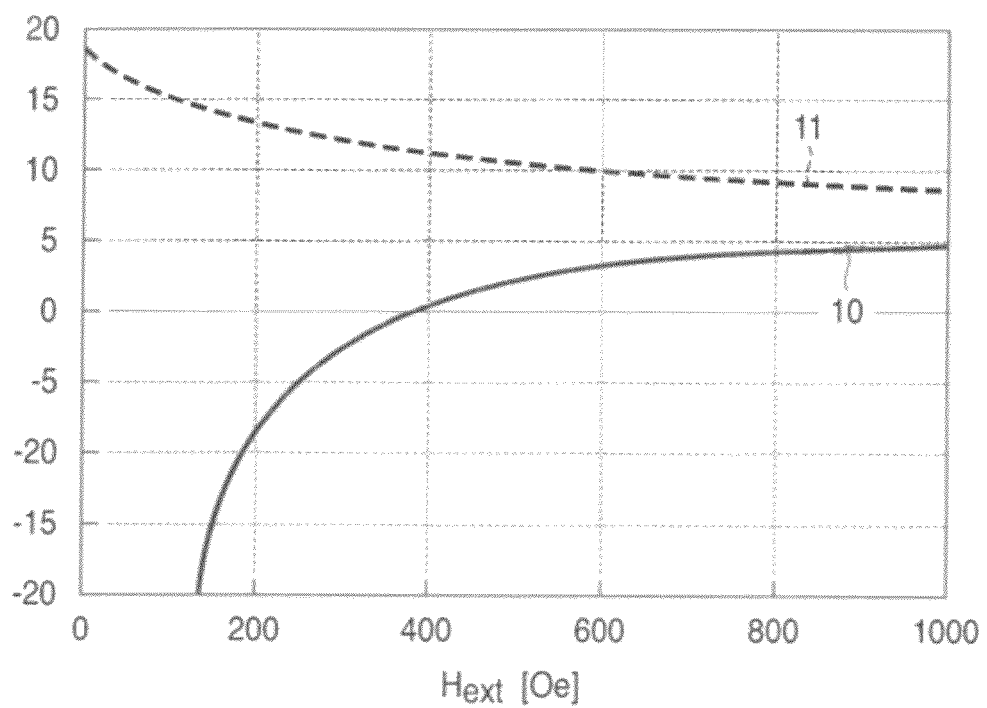
F I G. 4

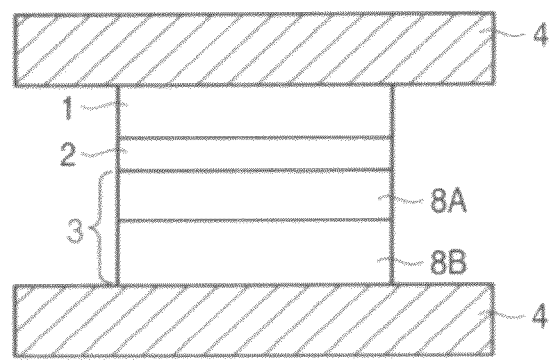
F I G. 9
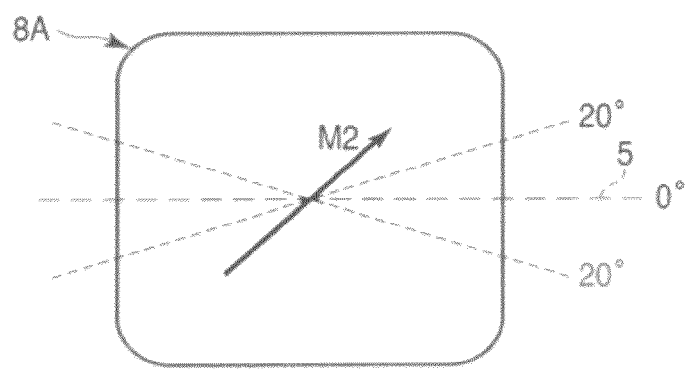
F I G. 10
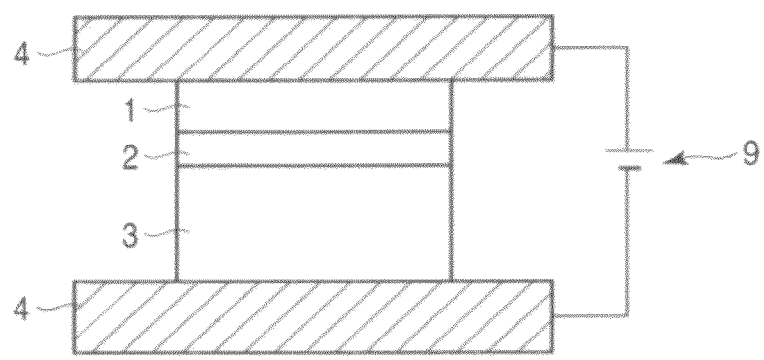
F I G. 11

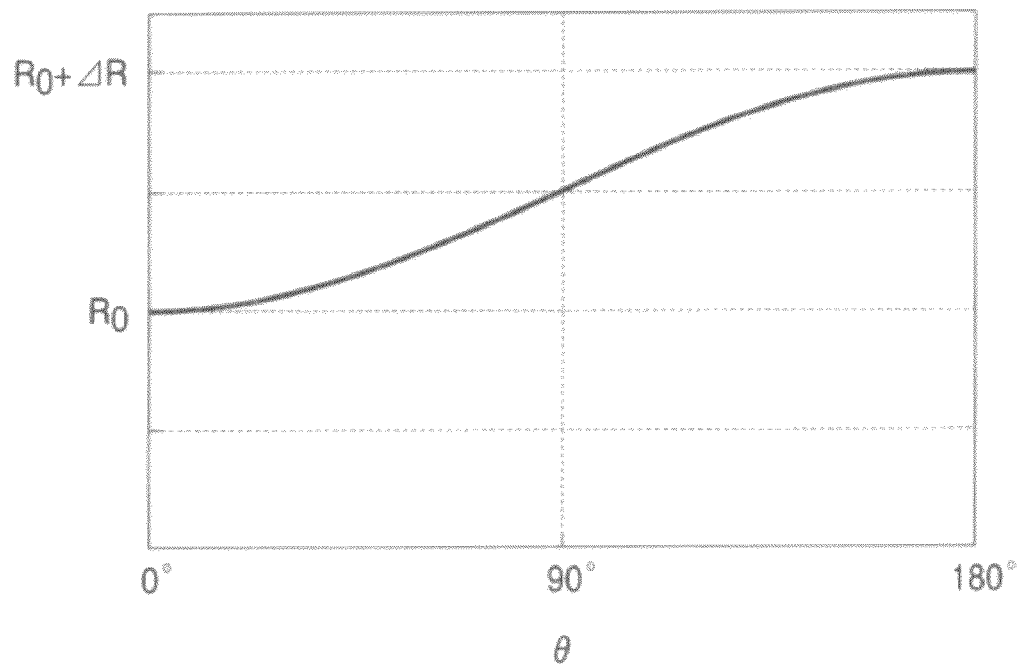
F I G. 12
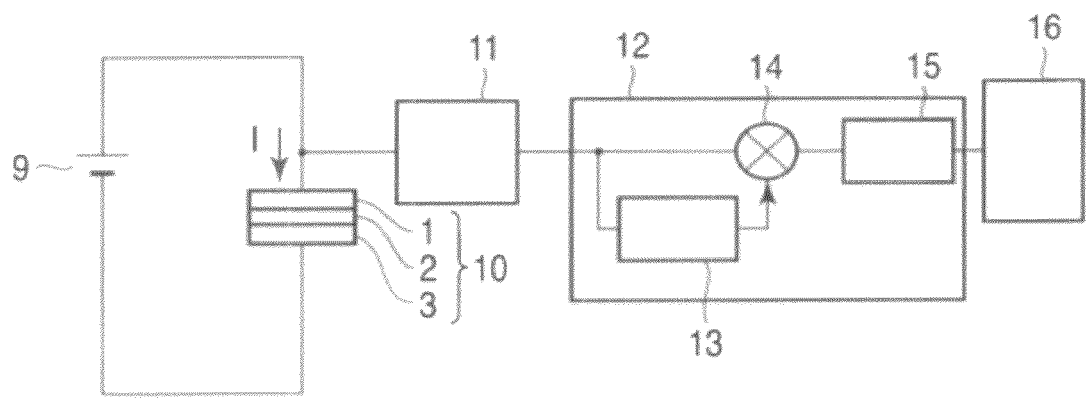
F I G. 13

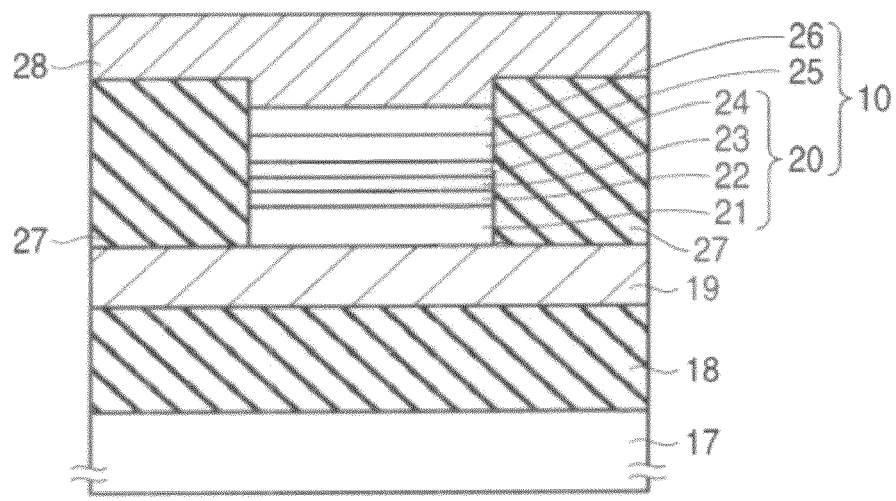
F I G. 14
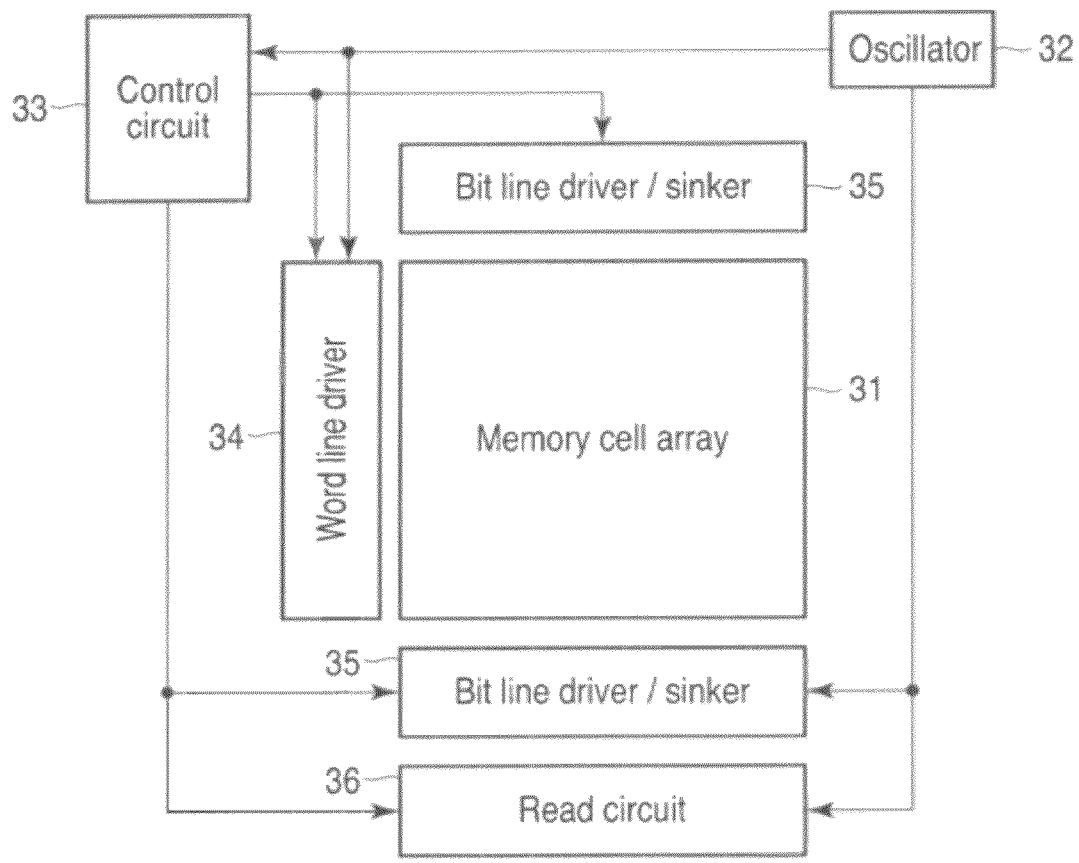
F I G. 15

MAGNETIC OSCILLATION ELEMENT

CROSS REFERENCE TO RELATED APPLICATIONS

This application is a Continuation Application of PCT Application No. PCT/JP2009/070045, filed Nov. 27, 2009 and based upon and claiming the benefit of priority from prior Japanese Patent Application No. 2009-041100, filed Feb. 24, 2009, the entire contents of all of which are incorporated herein by reference.

FIELD

Embodiments described herein relate generally to a magnetic oscillation element.

BACKGROUND

As is known, when DC current I larger than certain threshold current $I_C$ is supplied to a magnetoresistive effect element (MR element) such as a GMR element or TMR element, a spin torque acts on a free layer magnetization in the MR element, thus exciting a steady magnetization oscillation of several to several ten GHz (for example, see non-patent literatures 1 and 2).

This magnetization oscillation is converted into a high-frequency power by an MR effect. A typical element size that allows to observe this phenomenon is about 100 nm×100 nm.

This element is called a magnetic oscillation element since a microwave originates in a magnetic oscillation. Alternatively, this element is also called a spin-torque oscillator since the magnetization oscillation originates in a spin torque.

Use applications of the magnetic oscillation element, which exploit a micro-size oscillator, have been proposed. As one use application, the magnetic oscillation element is used as a reference clock in a portable electronic device.

When a conventional quartz oscillator is replaced by the magnetic oscillation element, not only a space required for the reference clock can be reduced, but also the reference clock can be integrated in a single transmitting and receiving circuit chip. Also, a use application as a local oscillator in a heterodyne detector is available so as to allow an RF spectrum analysis in a single chip.

Since the magnetic oscillation element is also an oscillating field generator originating in a magnetization oscillation, use applications which exploit that oscillating field have also been proposed. One of such use applications is related to a wireless communication, and in this use application, the magnetic oscillation element is applied as a wireless communication transmitter which assumes data transfer between individual components in a computer.

As a use application related to a magnetic recording/playback apparatus, that as an assist recording oscillating field generator is available, as disclosed in, for example, patent literature 1.

A use application which exploits that the magnetization oscillation in the magnetic oscillation element has a response characteristic to an external magnetic field has also be proposed. As a use application related to a wireless communication, the magnetic oscillation element is applied as a wireless communication receiver.

Furthermore, as the use application related to the magnetic recording/playback apparatus, for example, as disclosed in patent literatures 2 and 3, that as a playback head of the magnetic recording/playback apparatus has been proposed.

As principal characteristics required for the magnetic oscillation element common to various use applications, there are three elements, that is, efficient extraction of a high-frequency output from the element, a high output on the μW order, and a stable oscillation frequency.

The reason why the stable oscillation frequency is desirable is obvious in consideration of the use application as a local oscillator and that as a wireless communication transceiver. If the frequency is fluctuating, a role as a reference cannot be assumed, and wireless communication information is disturbed if it is sent at a given frequency.

In order to efficiently extract high frequency from the magnetic oscillation element, it is desired that an element resistance is about 100Ω. This is because many high-frequency devices are designed to have an intrinsic impedance of about 50Ω as a standard, and the magnetic oscillation element as a high-frequency device has to be adjusted to such standard.

Since a typical element size that excites a magnetization oscillation is about 100 nm×100 nm in the magnetic oscillation element, the magnetic oscillation element is required to have 1 Ω·μm² or less as its RA (a product of the element resistance and a junction area).

The requirement of the RA of 1 Ω·μm² or less is easily satisfied in a normal GMR element. In a TMR element, although it was impossible to satisfy such requirement in a conventional element, a technique for forming a spacer layer to have a film thickness of about 2 to 3 atoms has been advanced in recent years, and it is possible to set the RA to be 1 Ω·μm² or less.

On the other hand, in order to obtain a high output on the μW order from the magnetic oscillation element, it is indispensable to enhance the MR effect as the origin of the high-frequency output, that is, to enhance an MR ratio as its index.

As an element with a high MR ratio, a magnetic tunnel junction film having an MgO barrier, that is, a so-called MgO-MTJ, has received a lot of attention in recent years. The MgO-MTJ has an MR ratio as high as several hundred %, and it is well known that an output of several hundred nW can be extracted from a magnetization oscillation in the MgO-MTJ in practice.

However, since MgO is an insulating material, it poses a problem of an dielectric breakdown of an element. As a requirement for an element having a long service life without causing any dielectric breakdown, it is desired that a voltage applied to the element is about 0.1 V or less.

From the above two requirements, current density J of a current to be supplied to the element has to be smaller than $1.0\times10^7$ A/cm² (=0.1 V÷1 Ω·μm²). That is, if J<$1.0\times10^7$ A/cm² is satisfied, the two elements, that is, efficient extraction of the high-frequency output from the element and the high output on the μW order, can be solved by exploiting the conventional techniques.

However, a magnetic oscillation element which satisfies the last one element, that is, a stable oscillation frequency, has not been disclosed yet. That is, development of a magnetic oscillation element which satisfies all of the aforementioned three elements and, more specifically, which satisfies J<$1.0\times10^7$ A/cm² and has a stable oscillation frequency, is demanded.

BRIEF DESCRIPTION OF THE DRAWINGS

FIG. 3 is a graph showing the relationship of magnetization directions;

FIG. 4 is a graph showing a shift effect of an oscillation frequency;

FIGS. 9 and 10 are views showing a magnetic oscillation element according to the second embodiment;

FIG. 11 is a view showing a magnetic oscillation element according to the third embodiment;

FIG. 12 is a graph showing the relationship between a relative angle of magnetization directions and an element resistance;

FIG. 13 is a diagram showing a system example;

FIG. 14 is a view showing a manufacturing method; and

FIG. 15 is a view showing an application example to a magnetic random access memory.

DETAILED DESCRIPTION

Figure 1:
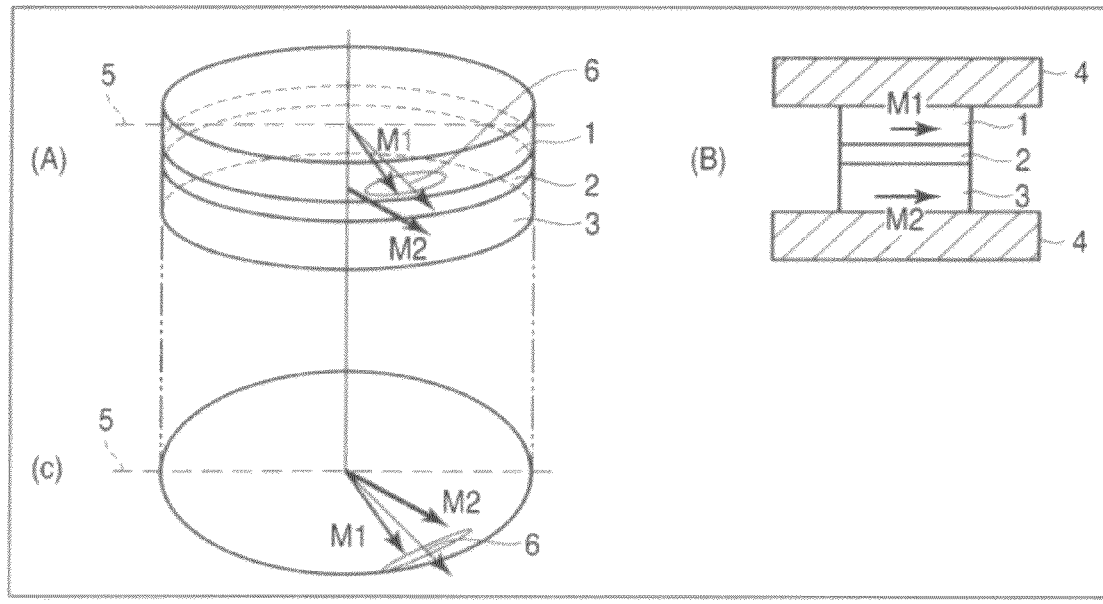
FIGS. 1 and 2 are views showing a magnetic oscillation element according to the first embodiment.

In general, according to one embodiment, a magnetic oscillation element comprising: a magnetic free layer having a variable magnetization direction; a magnetic pinned layer having an invariable magnetization direction; a spacer layer between the magnetic free layer and the magnetic pinned layer; and a magnetic field generator which applies an external magnetic field to the magnetic free layer, wherein the magnetization directions of the magnetic free layer and the magnetic pinned layer are parallel to junction planes between the magnetic free layer and the spacer layer and between the magnetic pinned layer and the spacer layer, the magnetic free layer has a uniaxial magnetic anisotropy, and generates a magnetization oscillation when a current larger than an oscillation threshold current flows through the magnetic free layer, the magnetic field generator controls a magnitude and a direction of the external magnetic field to cancel a shift amount of an oscillation frequency caused by a diamagnetic field due to the magnetization oscillation and a shift amount of the oscillation frequency caused by a magnetic field due to the uniaxial magnetic anisotropy, and an angle θ between a direction as a center of the magnetization oscillation of the magnetic free layer and the magnetization direction of the magnetic pinned layer is within ranges $0° \leq \theta \leq 70°$ and $110° \leq \theta \leq 180°$.

1. BASIC CONCEPT

Assume that a magnetic oscillation element is made up of a magnetoresistive effect element, and a magnetic free layer and magnetic pinned layer of the magnetoresistive effect element respectively have in-plane magnetizations.

As for the magnetic free layer, the in-plane magnetization means that the magnetization direction is parallel to a junction plane between the magnetic free layer and a spacer layer. As for the magnetic pinned layer, the in-plane magnetization means that the magnetization direction is parallel to a junction plane between the magnetic pinned layer and spacer layer.

Then, the magnetic oscillation element according to an embodiment uses a phenomenon that a magnetization oscillation is generated when a certain current is supplied to the magnetoresistive effect element. A frequency of this magnetization oscillation defines an oscillation frequency of the magnetic oscillation element. The certain current means a current having a current density higher than an oscillation threshold current density.

In the embodiment, an external magnetic field which acts in a direction to cancel a shift amount of the oscillation frequency caused by a diamagnetic field due to the magnetization oscillation of the magnetic free layer, and that of the oscillation frequency caused by a magnetic field due to a uniaxial magnetic anisotropy of the magnetic free layer is applied to the magnetic oscillation element.

Thus, stability of the oscillation frequency can be improved. More specifically, very narrow spectrum oscillation linewidth Δf as an index of the stability of the oscillation frequency can be set.

Also, in the embodiment, angle θ the magnetization direction as the center of the magnetization oscillation of the magnetic oscillation of the magnetic free layer and that of the magnetic pinned layer make is set to fall within ranges $0° \leq \theta \leq 70°$ and $110° \leq \theta \leq 180°$.

An oscillation within the range $0° \leq \theta \leq 70°$ is that (parallel oscillation) at which the magnetization directions of the magnetic free layer and magnetic pinned layer are parallel to each other. An oscillation within the range $110° \leq \theta \leq 180°$ is that (anti-parallel oscillation) at which the magnetization directions of the magnetic free layer and magnetic pinned layer are anti-parallel to each other.

The parallel magnetization directions mean that angle θ the oscillation central magnetization direction of the magnetic free layer and the magnetization direction of the magnetic pinned layer make falls within a range $0° \leq \theta \leq 90°$. The anti-parallel magnetization directions mean that angle θ the oscillation central magnetization direction of the magnetic free layer and the magnetization direction of the magnetic pinned layer make falls within a range $90° \leq \theta \leq 180°$.

Thus, since it becomes possible to excite the magnetization oscillation of the magnetic free layer at a current density smaller than $1.0 \times 10^7$ A/cm$^2$, a magnetic oscillation element having a high output and long service life can be obtained.

Furthermore, when the spacer layer is made up of MgO, a high-frequency output of a still higher output can be obtained.

2. EMBODIMENT

(1) First Embodiment

Figure 2:
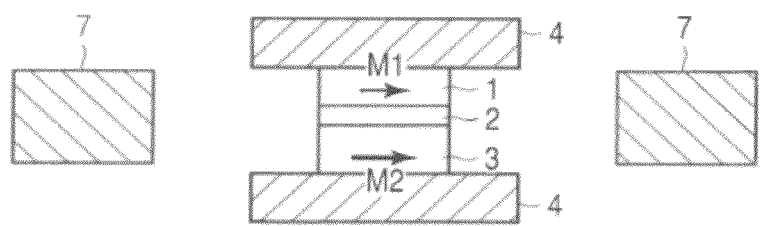

FIGS. 1 and 2 show a magnetic oscillation element according to the first embodiment.

A of FIG. 1 is a birds-eye view, B of FIG. 1 is a sectional view, and C of FIG. 1 is a perspective view. FIG. 2 shows an example of the positional relationship between a magnetic oscillation element and magnetic field generator.

The magnetic oscillation element is configured by magnetic free layer 1, spacer layer 2, magnetic pinned layer 3, and two electrodes 4. Magnetic free layer 1 is made up of a ferromagnetic material, and spacer layer 2 is made up of a non-magnetic layer (for example, MgO).

Magnetic free layer 1 has an in-plane magnetization and uniaxial magnetic anisotropy. Direction 5 of the uniaxial magnetic anisotropy of magnetic free layer 1 is shown in A and C of FIG. 1.

The uniaxial magnetic anisotropy can be generated by forming a material having a high crystal magnetic anisotropy in a uniform magnetic field or by annealing it in the uniform magnetic field after film formation. This is called a crystal magnetic anisotropy. Also, the uniaxial magnetic anisotropy can be generated by setting a shape of a ferromagnetic material to be a rectangular or elliptic shape. This is called a shape magnetic anisotropy.

A planar shape of magnetic free layer 1 is, for example, an elliptic shape which has direction 5 of the uniaxial magnetic anisotropy of magnetic free layer 1 as a major axis. A planer shape of magnetic pinned layer 3 may be the same as or different from that of magnetic free layer 1.

In this case, the planar shape of magnetic free layer 1 means a shape of magnetic free layer 1 in a plane parallel to a junction plane between magnetic free layer 1 and spacer layer 2. Also, the planar shape of magnetic pinned layer 3 means a shape of magnetic pinned layer 3 in a plane parallel to a junction plane between magnetic pinned layer 3 and spacer layer 2.

In this magnetic oscillation element, by flowing current (a current having a current density larger than an oscillation threshold current density) I larger than oscillation threshold current (a current having an oscillation threshold current density) Ic across two electrodes 4, the magnetization oscillation of magnetic free layer 1 is generated.

At this time, magnetic field generator 7 applies, to the magnetic oscillation element, an external magnetic field which acts in a direction to cancel a shift amount of the oscillation frequency caused by a diamagnetic field due to the magnetization oscillation of magnetic free layer 1, and that of the oscillation frequency caused by a magnetic field due to the uniaxial magnetic anisotropy of magnetic free layer 1.

As a result, very narrow spectrum oscillation linewidth Δf can be set, and the value of the oscillation frequency can be stabilized.

As for magnetization direction (variable) M1 of magnetic free layer 1, angle θ magnetization direction 6 as the center of the magnetization oscillation of magnetic free layer 1 and magnetization direction (invariable) M2 of magnetic pinned layer 3 make is set to fall within ranges 0°≦θ≦70° and 110°≦θ≦180°.

Then, since it becomes possible to excite the magnetization oscillation of the magnetic free layer at a current density smaller than $1.0 \times 10^7$ A/cm$^2$, a magnetic oscillation element having a high output and long service life can be obtained.

The stability of the oscillation frequency will be described below.

As in a conventional oscillator such as a laser or electric circuit oscillator, spectrum oscillation linewidth Δf as an index of the stability of the oscillation frequency can be given by:

$$\Delta f = \Delta f_{res} \times \frac{k_B T}{E_{osci}} \times \frac{1}{2}(1+\delta^2) \tag{1}$$

where Δfres is a resonator linewidth, kBT is a heat energy, and Eosci is a magnetization oscillation energy. Also, δ is a factor which represents the magnitude of a frequency shift effect, and the sign of a shift. Depending on definitions of the sign of δ, for example, if δ>0, it means a decrease in frequency (red shift); and if δ<0, it means an increase in frequency (blue shift).

The sign of δ will follow the following definitions.

Equation (1) shows that oscillation linewidth Δf increases if frequency shift effect |δ| is large. That is, equation (1) means that if frequency shift effect |δ| is large, the frequency stability deteriorates. Therefore, a most ideal state for a stable frequency is δ=0.

Magnitude δ of the frequency shift effect is called a linewidth enhancement factor especially in the laser technology field such as a semiconductor laser or quantization dot laser, since it enhances oscillation linewidth Δf, as described above.

As is conventionally known, in a thin-film ferromagnetic material such as an in-plane magnetization free layer (a magnetic free layer having an in-plane magnetization), when a magnetization exists nearly in plane, a shift effect of an oscillation frequency due to a diamagnetic field with respect to that magnetization is a red shift effect which decreases the oscillation frequency (for example, see non-patent literature 3).

On the other hand, according to the studies of the present inventors, when the magnetic free layer is provided with the uniaxial magnetic anisotropy, a shift effect of the oscillation frequency due to the uniaxial magnetic anisotropy with respect to the magnetization appears.

Especially, it is obvious according to the studies of the present inventors that, as shown in FIG. 3, when direction 6 as the center of the magnetization oscillation of magnetization M1 of the magnetic free layer is larger than 45° with respect to direction 5 of the uniaxial magnetic anisotropy of magnetic free layer 1, a blue shift effect, that is, the shift effect of the oscillation frequency due to the uniaxial magnetic anisotropy which increases the frequency, appears.

Therefore, in such case, the red shift effect (δ>0) caused by the diamagnetic field and the blue shift effect (δ<0) caused by a magnetic field due to the uniaxial magnetic anisotropy coexist.

Hence, by controlling, using an external magnetic field, direction 6 as the center of the magnetization oscillation of magnetization M1 of the in-plane magnetization free layer so that the red shift effect and blue shift effect cancel each other, δ=0 is realized, oscillation linewidth Δf is narrowed down, and a stable frequency (magnetization oscillation) can be obtained.

FIG. 4 shows a simulation result of the magnitude of the external magnetic field at which a shift amount (red shift effect) of the oscillation frequency caused by the diamagnetic field due to the magnetization oscillation, and a shift amount (blue shift effect) of the oscillation frequency caused by the magnetic field due to the uniaxial magnetic anisotropy cancel each other (δ=0).

Figure 5:
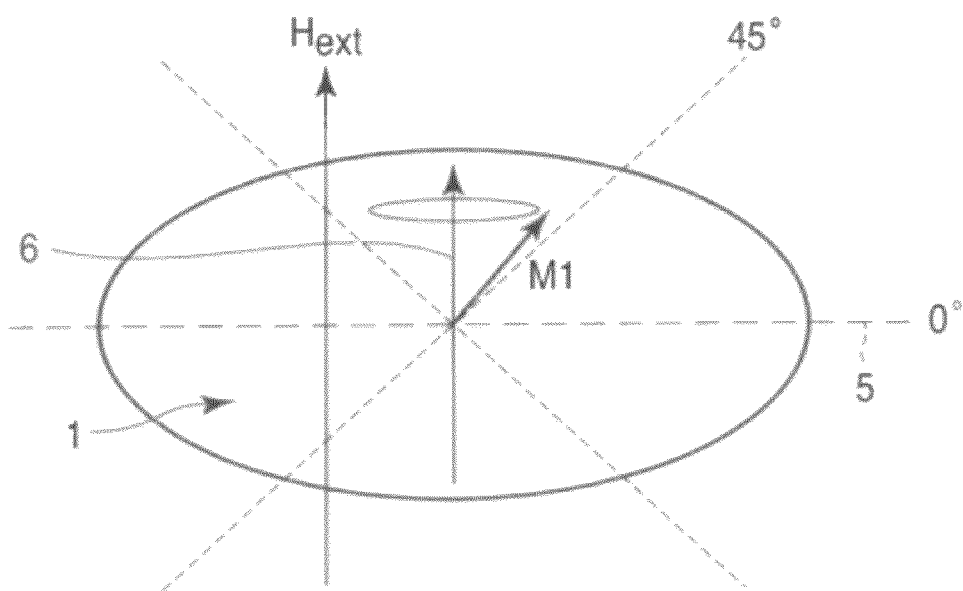
FIGS. 5 and 6 are graphs showing the relationship between an external magnetic field and magnetization directions.
Figure 6:
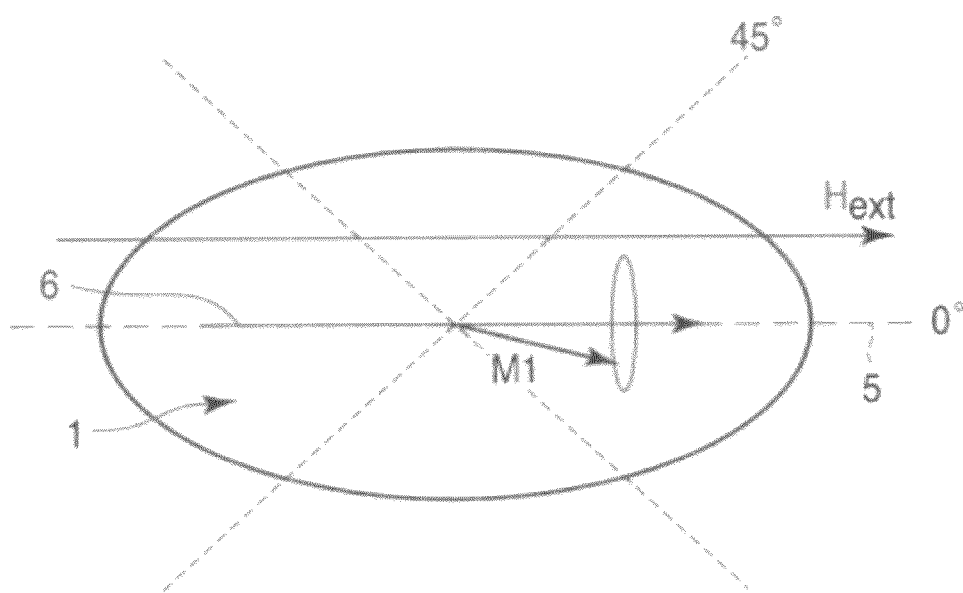

FIGS. 5 and 6 show conditions required to obtain the simulation result shown in FIG. 4.

In FIG. 5, direction 6 as the center of the magnetization oscillation of magnetization M1 of magnetic free layer 1 is perpendicular to direction 5 of the uniaxial magnetic anisotropy of magnetic free layer 1 (90°), and is larger than 45° with respect to direction 5 of the uniaxial magnetic anisotropy. A direction of external magnetic field Hext is parallel to direction 6 as the center of the magnetization oscillation of magnetization M1 of magnetic free layer 1.

By contrast, in FIG. 6, direction 6 as the center of the magnetization oscillation of magnetization M1 of magnetic free layer 1 is parallel to direction 5 of the uniaxial magnetic anisotropy of magnetic free layer 1 (0°), and is smaller than 45° with respect to direction 5 of the uniaxial magnetic anisotropy. The direction of external magnetic field Hext is parallel to direction 6 as the center of the magnetization oscillation of magnetization M1 of magnetic free layer 1.

This simulation is based on the Landau-Lifshitz-Gilbert equation which is often used in the magnetic device studies.

The simulation uses a typical value of 10000 [Oe] as the magnitude of diamagnetic field 4 πMS and a typical value of 100 [Oe] as the magnitude of the magnetic field of the uniaxial magnetic anisotropy. Also, Gilbert damping α is set to be 0.02.

In FIG. 4, curve 10 represents the simulation result under the condition of FIG. 5, and δ=0 when external field Hext=380 [Oe], that is, the shift amount (red shift effect) of the oscillation frequency caused by the diamagnetic field due to the magnetization oscillation and the shift amount (blue shift effect) of the oscillation frequency caused by the magnetic field due to the uniaxial magnetic anisotropy cancel each other.

However, in FIG. 4, curve 11 obtained under the condition of FIG. 6 always meets δ>0 for external magnetic field Hext.

A difference between these behaviors depends on whether direction 6 as the center of the magnetization oscillation of magnetization M1 of magnetic free layer 1 is larger or smaller than 45° with respect to direction 5 of the uniaxial magnetic anisotropy of magnetic free layer 1. The reason why this angle "45°" becomes a boundary value is that the sign of the direction of the magnetic field caused by the uniaxial magnetic anisotropy with respect to magnetization M1 of magnetic free layer 1 is inverted at that angle.

To summarize the above description, the stability of the oscillation frequency is attained by generating external magnetic field Hext in the direction to cancel the shift amount of the oscillation frequency caused by the diamagnetic field in the magnetization oscillation of magnetic free layer 1, and that of the oscillation frequency caused by the magnetic field due to the uniaxial magnetic anisotropy of magnetic free layer 1.

Especially, when direction 6 as the center of the magnetization oscillation of magnetization M1 of magnetic free layer 1 is set to be larger than 45° with respect to direction 5 of the uniaxial magnetic anisotropy of free magnetic layer 1, δ=0 is satisfied, thus improving the stability of the oscillation frequency.

The high output and long service life due to the low current density will be described below.

These effects are attained by setting angle θ the direction as the center of the magnetization oscillation of the magnetic free layer and the magnetization direction of the magnetic pinned layer make to fall within the ranges 0°≦θ≦70° and 110°≦θ≦180°, and setting current density J of a current to be supplied to the magnetic oscillation element to be smaller than $1.0 \times 10^7$ A/cm².

Figure 7:
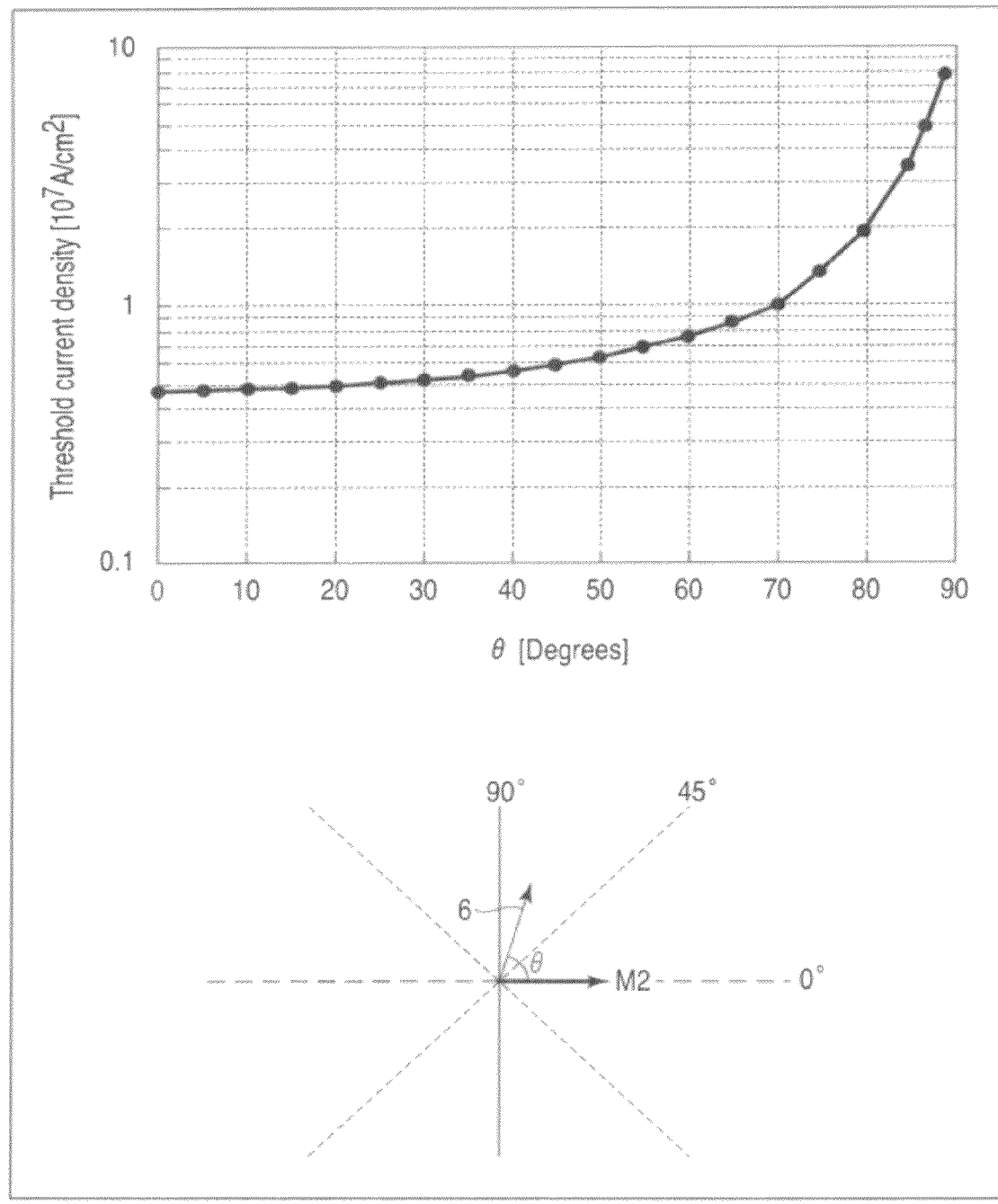
FIGS. 7 and 8 are graphs showing an oscillation threshold current density.
Figure 8:
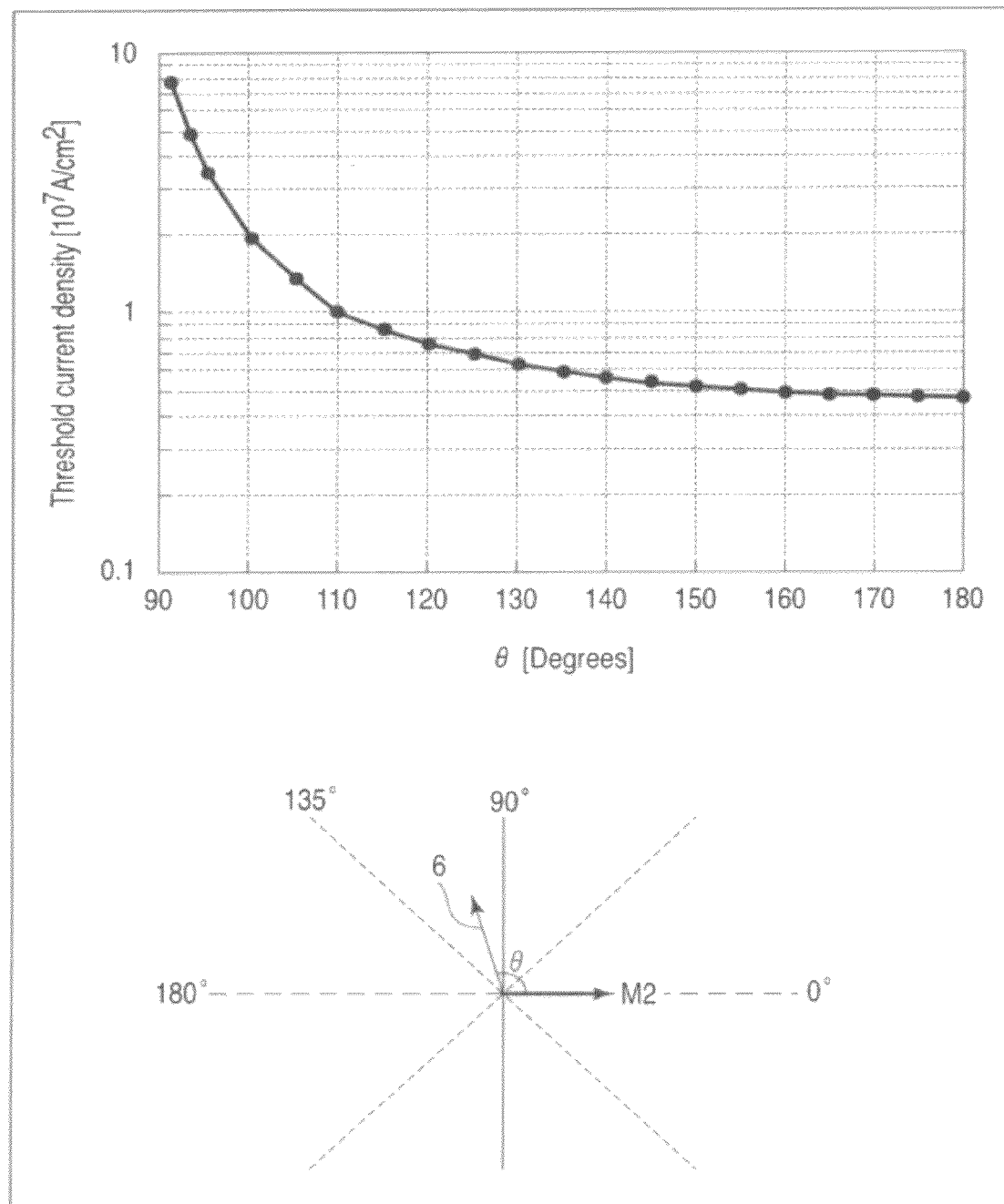

FIGS. 7 and 8 show the relationship between the oscillation threshold current density and angle θ the direction as the center of the magnetization oscillation of the magnetic free layer and the magnetization direction of the magnetic pinned layer make.

This relationship is a simulation result of the Landau-Lifshitz-Gilbert-Slonczewski equation. Thickness (a width of the magnetic free layer in a direction perpendicular to the junction plane between the magnetic free layer and spacer layer) d of the magnetic free layer was 2 nm, saturated magnetization MS was 600 emu/cm³, spin polarization ratio P was 0.3, magnitude Hext of the external magnetic field was 0.08×4 πMS, and magnitude Hk of the magnetic field due to the uniaxial magnetic anisotropy was 0.02×4 πMS.

The simulation in FIG. 7 is related to the oscillation (parallel oscillation) at which the magnetization directions of the magnetic free layer and magnetic pinned layer are parallel to each other. According to the result of this simulation, the oscillation threshold current density increases with increasing θ within the range 0°≦θ≦90°. One object of the embodiment is to set the current density of a current to be supplied to the magnetic oscillation element, that is, oscillation threshold current density J to be smaller than $1.0 \times 10^7$ A/cm². Hence, as can be seen from the above description, 0°≦θ≦70° is to be met for this purpose.

The simulation in FIG. 8 is related to the oscillation (anti-parallel oscillation) at which the magnetization directions of the magnetic free layer and magnetic pinned layer are anti-parallel to each other. According to the result of this simulation, the oscillation threshold current density increases with decreasing θ within the range 90°≦θ≦180°. When θ is replaced by θ' (=180−θ), the oscillation threshold current density increases with increasing θ' within the range 0°≦θ'≦90°, as in FIG. 7. Therefore, if 0°≦θ≦70°, oscillation threshold current density J can be set to be smaller than $1.0 \times 10^7$ A/cm². 0°≦θ≦70° is equivalent to 110°≦θ≦180°.

A physical reason why the oscillation threshold current density becomes very large at θ=90° is that a cause of excitation of the magnetization oscillation of magnetization M1 of the magnetic free layer lies in a spin torque. The spin torque that acts on magnetization M1 is expressed by:

$$a_J \cdot M1 \times (M1 \times M2) \tag{2}$$

where × is a vector product, and $a_J$ is a real number proportional to a current to be supplied to the magnetic free layer. Formula (2) expresses an amount which becomes very small when θ≈90°, since it is proportional to cos θ with respect to magnetization M1 of the in-plane magnetization free layer and magnetization M2 of the in-plane magnetization pinned layer. For this reason, when θ≈90°, a spin torque as large as that which can excite the magnetization oscillation of magnetization M1 of the magnetic free layer cannot be generated unless $a_J$, that is, the current density of a current to be supplied to the magnetic free layer is set to be very large.

As described above, in the magnetic oscillation element according to the first embodiment of the embodiments, the stability of the oscillation frequency can be improved by generating the external magnetic field in the direction to cancel the shift amount of the oscillation frequency caused by the diamagnetic field due to the magnetization oscillation of the magnetic free layer and that of the oscillation frequency caused by the magnetic field due to the uniaxial magnetic anisotropy of the magnetic free layer.

In addition, by setting the direction as the center of the magnetization oscillation of the magnetization of the magnetic free layer to be larger than 45° with respect to the direction of the uniaxial magnetic anisotropy of the magnetic free layer, δ=0 is satisfied, thus further improving the stability of the oscillation frequency.

Furthermore, by setting angle θ the magnetization direction as the center of the magnetization oscillation of the magnetic free layer and that of the magnetic pinned layer make to fall within the range 0°≦θ≦70° and 110°≦θ≦180°, the magnetization oscillation of the magnetic free layer can be excited at the current density smaller than $1.0 \times 10^7$ A/cm², thus obtaining the magnetic oscillation element having a high output and long service life.

When the spacer layer is made up of MgO, a high-frequency output of a still higher output can be obtained.

(2) Second Embodiment

FIG. 9 shows a magnetic oscillation element according to the second embodiment.

A characteristic feature of the magnetic oscillation element according to the second embodiment lies in the structure of magnetic pinned layer 3. Other features are the same as those of the first embodiment.

The magnetic oscillation element is configured by magnetic free layer 1, spacer layer 2, magnetic pinned layer 3, and two electrodes 4. Magnetic free layer 1 is made up of a ferromagnetic material, and spacer layer 2 is made up of a non-magnetic layer (for example, MgO).

Magnetic free layer 1 has an in-plane magnetization and uniaxial magnetic anisotropy. FIG. 10 shows direction 5 of the uniaxial magnetic anisotropy of magnetic free layer 1.

Magnetic pinned layer 3 is configured by a multi-layered structure of ferromagnetic layer 8A and anti-ferromagnetic layer (for example, IrMn) 8B. Anti-ferromagnetic layer 8B fixes a magnetization direction of ferromagnetic layer 8A, that is, that of magnetic pinned layer 3 by exchange coupling with ferromagnetic layer 8A.

In this case, as shown in FIG. 10, the magnetization direction (magnetizing direction) of magnetization M2 of magnetic pinned layer 3 is preferably set to be larger than 20° with respect to direction 5 of the uniaxial magnetic anisotropy of magnetic free layer 1.

This is because with this setting, it becomes easier to set an angle the magnetization direction as the center of the magnetization oscillation of magnetic free layer 1 and magnetization direction M2 of magnetic pinned layer 3 make to be small for a parallel oscillation and to be large for an anti-parallel oscillation.

In the magnetic oscillation element of the second embodiment as well, the magnetization oscillation of magnetic free layer 1 is generated by flowing, across two electrodes 4, current (a current having a current density larger than an oscillation threshold current density) I larger than oscillation threshold current (a current having the oscillation threshold current density) Ic.

At this time, an external magnetic field, which acts in a direction to cancel a shift amount of the oscillation frequency caused by a diamagnetic field due to the magnetization oscillation of magnetic free layer 1 and that of the oscillation frequency caused by a magnetic field due to the uniaxial magnetic anisotropy of magnetic free layer 1, is applied to the magnetic oscillation element.

As a result, very narrow spectrum oscillation linewidth Δf is set, thus stabilizing the value of the oscillation frequency.

Also, by setting the direction as the center of the magnetization oscillation of the magnetization of magnetic free layer 1 to be larger than 45° with respect to direction 5 of the uniaxial magnetic anisotropy of magnetic free layer 1, δ=0 is satisfied, thus further improving the stability of the oscillation frequency.

Furthermore, by setting angle θ the magnetization direction as the center of the magnetization oscillation of magnetic free layer 1 and magnetization direction M2 of magnetic pinned layer 3 make to fall within ranges 0°≦θ≦70° and 110°≦θ≦180°, the magnetization oscillation of the magnetic free layer can be excited by a current density smaller than $1.0 \times 10^7$ A/cm$^2$, thus realizing the magnetic oscillation element having a high output and long service life.

(3) Third Embodiment

FIG. 11 shows a magnetic oscillation element according to the third embodiment.

A characteristic feature of the magnetic oscillation element according to the third embodiment lies in that constant voltage source 9 is connected between two electrodes 4. Other features are the same as those in the first embodiment.

In semiconductor devices, voltage driving predominates. For this reason, when a magnetic oscillation element according to the embodiment is integrated with a semiconductor device to configure a composite device, it is preferable to drive the magnetic oscillation element by a constant voltage.

Since the magnetic oscillation element according to the embodiment is configured by a magnetoresistive effect element, element resistance R changes depending on relative angle θ between magnetization M1 of magnetic free layer 1 and magnetization M2 of magnetic pinned layer 3. Element resistance R typically has an angle dependence given by:

$$R = R0 + \Delta R (1 - \cos 2(\theta/2)) \quad (3)$$

FIG. 12 plots equation (3).

Element resistance R increases with increasing θ. On the other hand, when the magnetic oscillation element according to the embodiment is driven by constant voltage V, current I which flows through the magnetic oscillation element decreases with increasing θ according to the Ohm's law I=V/R.

As has already been described above, since one object of the embodiment is to decrease a current density of a current to be supplied to the magnetic oscillation element, θ is preferably set to be as small as possible, so as to excite a magnetic oscillation of magnetization M1 of magnetic free layer 1 by smaller constant voltage V.

In the magnetic oscillation element of the third embodiment as well, the magnetization oscillation of magnetic free layer 1 is generated by flowing, across two electrodes 4, current (a current having a current density larger than an oscillation threshold current density) I larger than oscillation threshold current (a current having the oscillation threshold current density) Ic.

At this time, an external magnetic field, which acts in a direction to cancel a shift amount of the oscillation frequency caused by a diamagnetic field due to the magnetization oscillation of magnetic free layer 1 and that of the oscillation frequency caused by a magnetic field due to the uniaxial magnetic anisotropy of magnetic free layer 1, is applied to the magnetic oscillation element.

As a result, very narrow spectrum oscillation linewidth Δf is set, thus stabilizing the value of the oscillation frequency.

Also, by setting the direction as the center of the magnetization oscillation of the magnetization of magnetic free layer 1 to be larger than 45° with respect to the direction of the uniaxial magnetic anisotropy of magnetic free layer 1, δ=0 is satisfied, thus further improving the stability of the oscillation frequency.

Furthermore, by setting angle θ the magnetization direction as the center of the magnetization oscillation of magnetic free layer 1 and magnetization direction M2 of magnetic pinned layer 3 make to fall within ranges 0°≦θ≦70° and 110°≦θ≦180°, the magnetization oscillation of the magnetic free layer can be excited by a current density smaller than $1.0 \times 10^7$ A/cm$^2$, thus realizing the magnetic oscillation element having a high output and long service life.

3. EXAMPLE OF SYSTEM

An example of a system which extracts a high-frequency signal from a magnetic oscillation element according to the embodiment will be described below.

FIG. 13 shows an oscillator as a system having a magnetic oscillation element.

Constant voltage source 9 is connected to magnetic oscillation element 10 to supply DC current I to magnetic oscillation element 10, thus generating a magnetization oscillation of magnetic free layer 1. For example, the following system detects a high-frequency signal from magnetic oscillation element 10 due to a periodic change of element resistance R of magnetic oscillation element 10 as a result of this magnetization oscillation.

The high-frequency signal is input to delay detection circuit 12 via high-pass filter 11. High-pass filter 11 removes noise other than the high-frequency signal.

Delay detection circuit 12 splits the high-frequency signal into two signals. One signal is directly input to mixer 14, and the other signal is input to mixer 14 via delay circuit 13. Mixer 14 generates a voltage of a constant frequency by multiplying these two high-frequency signals.

Low-pass filter 15 removes noise other than the voltage of the constant frequency generated by mixer 14.

Finally, high-frequency signal generation circuit 16 generates a high-frequency signal (for example, a clock signal required to control a semiconductor device) based on the voltage of the constant frequency.

According to this system, a high-frequency signal can be extracted at high speed from magnetic oscillation element 10. Note that a high-frequency signal may be generated using systems other than that described above.

4. MANUFACTURING METHOD

A manufacturing method of a magnetic oscillation element and material examples will be described below with reference to FIG. 14.

Insulating layer 18 made up of, for example, $SiO_2$ is formed on semiconductor substrate 17 by CVD. Also, lower electrode 19 made up of, for example, a Ta/Cu/Ta multi-layered structure is formed on insulating layer 18 by sputtering.

After that, magnetic oscillation element 10 is formed on lower electrode 19.

Magnetic oscillation element (magnetoresistive effect element) 10 is formed by forming a multi-layered structure of ferromagnetic layer 20, non-magnetic layer 25, and ferromagnetic layer 26 on lower electrode 19.

When the magnetic oscillation element is configured as a bottom pin type, ferromagnetic layer 20 serves as a magnetic pinned layer, and ferromagnetic layer 26 serves as a magnetic free layer. When the magnetic oscillation element is configured as a top pin type, ferromagnetic layer 20 serves as a magnetic free layer, and ferromagnetic layer 26 serves as a magnetic pinned layer.

A case will be explained wherein the magnetic oscillation element is configured as the bottom pin type.

In this case, ferromagnetic layer 20 is configured by, for example, a multi-layered structure of anti-ferromagnetic layer 21/ferromagnetic layer 22/non-magnetic layer 23/ferromagnetic layer 24.

Anti-ferromagnetic layer 21 is made up of, for example, IrMn.

Ferromagnetic layer 22, non-magnetic layer 23, and ferromagnetic layer 24 have, for example, an SAF (synthetic anti-ferromagnetic) structure in which two ferromagnetic layers are magnetically exchange-coupled. Ferromagnetic layer 22 is made up of, for example, CoFe, non-magnetic layer 23 is made up of, for example, Ru, and ferromagnetic layer 24 is made up of, for example, CoFeB.

Non-magnetic layer 25 serves as a tunnel barrier layer, and is made up of, for example, MgO.

The multi-layered structure of ferromagnetic layer 20, non-magnetic layer 25, and ferromagnetic layer 26 is then patterned by lithography and RIE. As a result, for example, magnetic oscillation element 10 whose planar shape is an elliptic shape is formed.

Also, insulating layer 27 which surrounds this magnetic oscillation element 10 is formed. Insulating layer 27 is made up of, for example, $SiO_2$.

Finally, upper electrode 28, which is made up of, for example, an Au/Cu multi-layered structure, is formed on magnetic oscillation element 10.

The present inventors confirmed that when a constant voltage is applied across lower electrode 19 and upper electrode 28 to generate a DC current in the magnetic oscillation element 10, a precession movement occurred in a magnetization of ferromagnetic layer (CoFeB) 26 as the magnetic free layer.

Note that a planar shape (size) of magnetic oscillation element 10 is an elliptic shape of 60 nm (minor axis)×120 nm (major axis).

A uniaxial magnetic anisotropy of ferromagnetic layer 26 was given by a shape magnetic anisotropy, so that a major axis direction was defined as an axis of easy magnetization, and a minor axis direction was defined as an axis of hard magnetization. A magnetic field generated by the uniaxial magnetic anisotropy was about 250 Oe.

Furthermore, element resistance R of this magnetic oscillation element 10 was about 48Ω, and an MR ratio was about 6.8%.

5. APPLICATION EXAMPLE

A magnetic oscillation element according to the embodiment is made up of a magnetoresistive effect element.

When the magnetic oscillation element is used as, for example, an oscillator which generates a clock signal (reference clock) required to control the operation timing of a semiconductor integrated circuit, it is effective to attain a manufacturing cost reduction by commonizing the manufacturing process of the magnetic oscillation element and that of the semiconductor integrated circuit.

As a next-generation memory, a spin transfer torque random access memory including a magnetoresistive effect element as each memory cell is known.

The spin transfer torque random access memory is characterized in that magnetization switching (writing) is attained by a spin torque.

Thus, for example, it is very effective to apply the magnetic oscillation element according to the embodiment to a magnetic random access memory, as shown in FIG. 15.

This is because a magnetic oscillation element in oscillator 32 can be formed simultaneously with memory cells (magnetoresistive effect elements) in memory cell array 31.

In this case, a clock signal (reference clock) generated by oscillator 32 configured by the magnetic oscillation element is supplied to control circuit 33, word line driver 34, bit line driver/sinker 35, and read circuit 36.

6. CONCLUSION

According to the embodiment, a magnetic oscillation element, which has a high output and long service life, and in which an oscillation frequency is stable, can be attained.

According to the embodiment, industrial merits are significant to a reference clock in a portable electronic device, a reference clock in a single transmitting/receiving circuit chip, a local oscillator for a single-chip RF spectrum analyzer, a transceiver for wireless communications, a high-frequency assist recording element, a magnetic sensor, and so forth.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A magnetic oscillation element comprising:
   a magnetic free layer having a variable magnetization direction;
   a magnetic pinned layer having an invariable magnetization direction;
   a spacer layer between the magnetic free layer and the magnetic pinned layer; and a magnetic field generator which applies an external magnetic field to the magnetic free layer, wherein the magnetization directions of the magnetic free layer and the magnetic pinned layer are parallel to junction planes between the magnetic free layer and the spacer layer and between the magnetic pinned layer and the spacer layer, the magnetic free layer has a uniaxial magnetic anisotropy, and generates a magnetization oscillation when a current larger than an oscillation threshold current flows through the magnetic free layer, the magnetic field generator controls a magnitude and a direction of the external magnetic field to cancel a shift amount of an oscillation frequency caused by a diamagnetic field due to the magnetization oscillation and a shift amount of the oscillation frequency caused by a magnetic field due to the uniaxial magnetic anisotropy, and an angle $\theta$ between a direction as a center of the magnetization oscillation of the magnetic free layer and the magnetization direction of the magnetic pinned layer is within ranges $0° \leqq \theta \leqq 70°$ and $110° \leqq \theta \leqq 180°$.

2. The element of claim 1, wherein the direction as the center of the magnetization oscillation of the magnetic free layer is larger than 45° with respect to the direction of the uniaxial magnetic anisotropy.

3. The element of claim 1, wherein the magnetization direction of the magnetic pinned layer is larger than 20° with respect to the direction of the uniaxial magnetic anisotropy.

4. The element of claim 1, wherein a planar shape of the magnetic free layer is an elliptic shape having the direction of the uniaxial magnetic anisotropy as a major axis.

5. The element of claim 1, wherein the oscillation frequency is used as a frequency of a reference clock of a semiconductor integrated circuit.

* * * * *